United States Patent [19]
Burns

[11] Patent Number: 5,828,329
[45] Date of Patent: Oct. 27, 1998

[54] ADJUSTABLE TEMPERATURE COEFFICIENT CURRENT REFERENCE

[75] Inventor: Lawrence M. Burns, Mountain View, Calif.

[73] Assignee: 3COM Corporation, Santa Clara, Calif.

[21] Appl. No.: 760,504

[22] Filed: Dec. 5, 1996

[51] Int. Cl.$^6$ .............................. G05F 3/26; H03M 1/00
[52] U.S. Cl. ............................................. 341/155; 323/315
[58] Field of Search .................................... 341/144, 155, 341/160, 153, 135, 136, 119; 327/83, 96; 323/313, 315

[56] References Cited

U.S. PATENT DOCUMENTS

| | | | |
|---|---|---|---|
| 5,394,078 | 2/1995 | Brokaw | 323/313 |
| 5,519,308 | 5/1996 | Gilbert | 323/313 |
| 5,563,504 | 10/1996 | Gilbert et al. | 323/316 |
| 5,589,792 | 12/1996 | Brokaw | 327/512 |
| 5,630,228 | 5/1997 | Mittel | 455/236 |
| 5,672,619 | 9/1997 | Entrikin et al. | 323/315 |

OTHER PUBLICATIONS

Wai–Kai Chen, ed., *The Circuits and Filters Handbook*, CRC Press, Boca Raton, Florida, 1995, pp. 1619–1628.

Toumazou et al., eds., *Analogue IC design: the current–mode approach*, Peter Perginus, Ltd., London, United Kindom, 1990, pp. 74–78.

Paul Horowitz, Winfiel Hill, *The Art of Electronics*, Cambridge University Press, New York, 1989, pp. 79–81, 614–617, 621–622.

Leon W. Couch II, *Digital and Analog Communications Systems*, Macmillan Publishing Co., Inc., New York, 1983, pp. 214–223.

Kimura; Low Temperature coefficient CMOS Voltage Reference; IEICEtransactions on Fundamentals of Electronics; vol. E77–A; pp. 398–402, Feb. 1994.

Brokaw; Temperature Sensor with Single resistor Set Point Programming; IEEE Intrenational Solid–State Circuits Conferecnce; vol. 39; pp. 334–335, Feb. 1996.

*Primary Examiner*—Howard L. Williams
*Assistant Examiner*—Peguy JeanPierre
*Attorney, Agent, or Firm*—Koppel & Jacobs

[57] ABSTRACT

A current reference combines proportional to absolute temperature and complementary to absolute temperature current sources to produce a current reference that is relatively immune to power supply variations and features a temperature coefficient which may be adjusted to yield a positive, negative or zero tempco. In its preferred embodiment, the new current reference may be advantageously employed within an analog to digital converter (ADC) to yield equal quantization values in spite of variations in the ADC's supply voltage and temperature. Additionally, the tempco may be adjusted to permit the ADC's quantization valued to "track" variations in circuitry which produce the analog signals converted by the ADC.

14 Claims, 5 Drawing Sheets

005,828,329

ADJUSTABLE TEMPERATURE COEFFICIENT CURRENT REFERENCE

BACKGROUND OF THE INVENTION

1. Field of the Invention

The invention is related to circuits for generating reference currents and, in particular, to a current reference circuit with a temperature coefficient (tempco) that can be adjusted without substantially affecting its immunity to power supply variations.

2. Description of the Related Art

Current mirrors are widely used integrated circuit (IC) "building blocks". Because matched transistors (i.e., transistors with similar doping profiles, junction areas, etc.) are relatively easy to come by in IC designs, current mirrors, which employ matched (or ratioed) transistors, are used in both digital and analog ICs for biasing circuits, current sources, differential to single ended converters, differential amplifiers and comparators, to name just a few of their applications. Various current mirror circuits have been developed and some of them are discussed in Wai-Kai Chen, ed., *The Circuits and Filters Handbook*, CRC press, Boca Raton, Fla., 1995, pp 1619–1628 and in C. Toumazou, F. J. Lidgey & D. G. Haigh. eds., *Analogue IC design: the current-mode approach* Peter Pereginus, Ltd. London, United Kingdom 1990 pp. 74–78.

A basic current mirror is illustrated in FIG. 1. A pair of matched transistors Q1, Q2 have their bases connected together and their emitters connected to a negative supply terminal V−. Q1 is diode-connected, with its collector connected to its base and also to a positive supply terminal V+ through a programming current source Ip which establishes a current that is mostly sourced to Q1. A load is connected between the positive supply terminal V+ and the collector of transistor Q2, causing a load current IL, equal to Ip to flow through the load.

The circuit could be inverted by using PNP bipolar transistors Q1 and Q2, with their emitters connected to V+ and their collectors connected to V− through the current source and load, respectively. All circuits disclosed herein are susceptible to this sort of inversion. The generic term "current terminal" as used herein refers to either the collector or emitter of a bipolar transistor and, generally, one may be exchanged for the other with proper substitution of transistor types, i.e., PNP for NPN. Additionally, the positive and negative supply terminals V+, V− are positive or negative with respect to one another in a relative rather than a purely absolute sense; either one may be below, above, or equal to "ground", for example.

In the example of FIG. 1, Ip flows into the collector of Q1 (ignoring second order effects such as base currents). Because transistors Q1 and Q2 are matched, their bases are tied together and their emitters are held at the same voltage, their base-emitter voltages are equal and the collector current of transistor Q2 will therefore equal that of transistor Q1. In this way, the collector current of transistor Q1 is "mirrored" by transistor Q2.

Although the circuit of FIG. 1 is suitable for numerous applications, the mirror's output impedance is limited and the circuit is sensitive to the current gain ($\beta$) of transistor Q2. Additionally, the current source Ip, is typically susceptible to changes in its supply voltage, and its temperature coefficient (tempco) is somewhat indeterminate. Furthermore, many conventional current sources, such as self-biasing current sources, do not have sufficient startup current and are therefore unreliable. For a more detailed discussion of these problems, see Wai-Kai Chen,ed., *The Circuits and Filters Handbook*, supra, pp 1620–1621.

SUMMARY OF THE INVENTION

The invention is directed to a current reference that produces a prescribed current output that is largely immune to variations in its supply voltage and whose temperature coefficient may be adjusted to be positive, negative or zero.

The invention comprises a proportional to absolute temperature (PTAT) current source combined with a complementary to absolute temperature (CTAT) current source. The PTAT current source is connected to supply a programming current to the CTAT current source, and the output current of the CTAT current source is taken as the reference current. The tempco of this output current may be adjusted by the selection of components within the constituent current sources. This may occur during manufacturing, and, using digitally controlled impedance networks, for example, this adjustment may be made "in the field". Additionally, although it is generally desirable that a reference be independent of power supply variations, the new current reference may be adjusted to vary proportionally, inversely or almost not at all with power supply variations.

The new current reference is particularly suited for use within analog to digital converters (ADCs). In a preferred embodiment it supplies a reference current to a differential ladder ADC. In this application, the new current reference supplies currents to the two legs of the ADC's differential ladder, thus establishing quantization levels which are substantially independent of variations in the ADC's supply voltage and which, because of the new current source's tempco adjustability, may be used to offset the temperature dependence of circuitry which supplies the signals that are to be converted from analog to digital form.

These and other features, aspects and advantages of the invention will be apparent to those skilled in the art from is the following detailed description, taken together with the accompanying drawings.

DETAILED DESCRIPTION OF THE INVENTION

Figure 1:
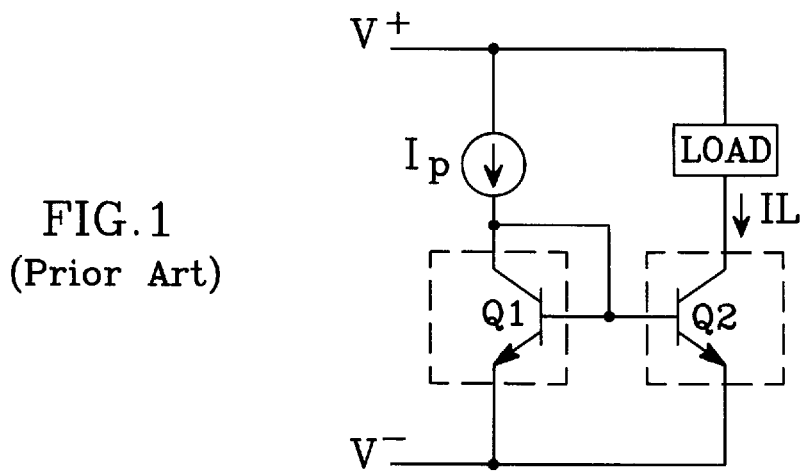
FIG. 1 is a schematic diagram of a conventional current mirror employed as a current source.
Figure 2:
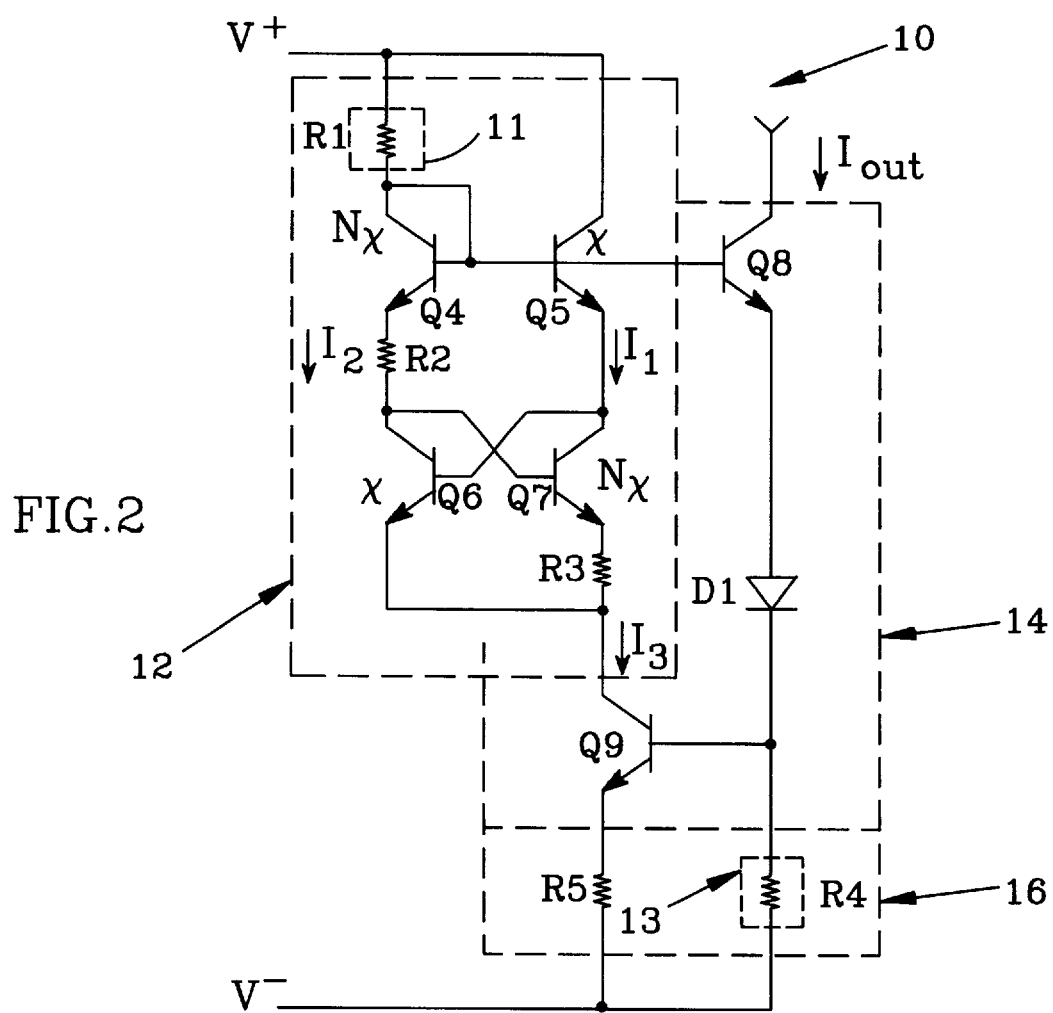
FIG. 2 is a schematic diagram of a new current source that provides both relative immunity to power supply variations and an adjustable tempco.

A new current reference 10 illustrated in the schematic diagram of FIG. 2 combines PTAT 12 and CTAT 14 current sources (a modified Wilson source) along with a base level current and tempco adjustment circuit 16. In general terms, the PTAT source 12 contributes a current that is proportional to absolute temperature, while the CTAT source 14 contributes a current that is complementary to absolute temperature; the sources may be adjusted to yield an overall tempco which can take on a range of values positive, negative and zero. This adjustment may be employed, for example, to offset the temperature dependence of another component within a system which employs the current reference 10. In this way the overall temperature dependence of the system may be substantially reduced.

Both the PTAT 12 and CTAT 14 current sources provide output currents that are somewhat insensitive to variations in the power supply voltage. By combining the two, the current reference 10 yields an output current that is substantially immune to such variations. This combination, i.e., of an adjustable tempco and power supply immunity, is particularly beneficial in circuits such as ADCS, as will be apparent from the discussion related to FIG. 3.

The cross-coupled PTAT current source 12 includes a transistor Q4 coupled through a resistor R1, which could be replaced by a programming current source 11, to a positive supply terminal V+ to receive a programming current. The resistor R1 preferably has a relatively high resistance and provides startup current to the new current source 10.

Another transistor Q5 has its collector coupled to the positive supply terminal V+ and forms a mirror with transistor Q4, i.e. the base of transistor Q4 is connected to its collector and to the base of transistor Q5. A current I1 flows from the emitter of transistor Q5. In the preferred embodiment transistors Q4 and Q5 are ratioed so that, for a given base-emitter voltage, the transistors' currents will differ by a factor N. Such ratioing is known in the art and may be effected, for example, by ratioing the emitter areas of the transistors Q4 and Q5 or by "paralleling" identical emitters to produce the desired ratio. In the preferred embodiment this ratio N is the same for Q4,Q5 as it is for transistors Q6 and Q7 discussed below. That is, Q4 is N times Q5 and Q7 is N times Q6.

In this exemplary embodiment, transistors Q4 and Q5 are NPN devices but, as noted in the background section, the circuit could be inverted, by using PNP bipolar transistors instead. All of the circuits to be discussed within this specification permit this sort of substitution and inversion. As with the prior art, the positive and negative supply terminals V+, V− are positive or negative with respect to one another; either one may be below, above, or equal to "ground".

The emitter of transistor Q4 is coupled through a resistor R2 to the collector of a NPN transistor Q6 and to the base of another NPN transistor Q7. A current I2 flows from the emitter of transistor Q4 through the resistor R2. Transistors Q6 and Q7 are cross-coupled, i.e., the base of transistor Q7 is connected to the collector of transistor Q6 and the base of transistor Q6 is connected to the collector of transistor Q7 and to the emitter of the transistor Q5. The transistors Q6 and Q7 are also ratioed, with the emitters of transistor Q7 N times larger than that of transistor Q6, i.e., the current through transistor Q7 is N times that through transistor Q6 for a given base-emitter voltage. The emitter of transistor Q7 is connected to a resistor R3, and a PTAT current I3 flows from the node connecting the emitter of the transistor Q6 and the resistor R3 to the CTAT current source 14.

Assuming that β>>1 for all the transistors Q4 through Q7, the PTAT current source may be analyzed as follows. Equating the voltage drops across the two legs of the current source 12 yields the following equation:

$$V_{BE5}+V_{BE6}=V_{BE4}+I2R2+V_{BE7}+I1R3 \quad (1)$$

or $$V_{BE5}+V_{BE6}-V_{BE4}-V_{BE7}=I2R2+I1R3 \quad (2)$$

Where:
$V_{BE4}$=the base-emitter voltage of transistor Q4
$V_{BE5}$=the base-emitter voltage of transistor Q5
$V_{BE6}$=the base-emitter voltage of transistor Q6
$V_{BE7}$=the base-emitter voltage of transistor Q7

Additionally, the current I3 delivered to the CTAT current source 14 is the sum of the currents through transistors Q6 and Q7:

$$I3=I1+I2 \quad (3)$$

Assuming that R2 and R3 have the same resistance value, R and substituting in equation (2) yields:

$$I1+I2=[V_{BE6}+V_{BE5}-V_{BE4}-V_{BE7}]/R \quad (4)$$

The transistors' base-emitter voltages are characterized by the Ebers-Moll approximation, which states that the base-emitter voltages will equal the product of their thermal voltage and the natural logarithm of the ratio of their collector currents to their saturation currents. That is:

$$V_{BE}=V_T \ln (Ic/Is) \quad (5)$$

where:
$V_T$=kT/q
k=Boltzmann's constant
T=temperature Kelvin
q=the electron charge
Ic=collector current
Is=saturation current A brief discussion of the Ebers-Moll model may be found in Paul Horowitz, Winfield Hill, *The Art of Electronics*, Cambridge University Press, New York, 1989 pp 79–81. Substitution of the Ebers-Moll expression into equations (3) and (4) yields:

$$I3 = I1 + I2 = [V_T\ln(I2/Is) + V_T\ln(I1/Is) - V_T\ln(I2/NIs) - V_T\ln(I1/NIs)]/R \quad (6)$$

$$= [V_T\ln(I2/Is)(NIs/I2) + V_T\ln(I1/Is)(NIs/I1)]/R \quad (7)$$

$$= [V_T\ln(N^2)]/R \quad (8)$$

That is, the output current I3 from the PTAT current source 12 is proportional to temperature, as evidenced by the $V_T$ term, and to the natural logarithm of the square of the transistor ratios N. It is important to note that this current is independent of the value of the resistor R1 and of the supply voltage (V+−V−) and, for a given transistor ratio N, provides an output current I3 that is purely temperature dependent.

The CTAT current source 14 includes an NPN transistor Q8 with its base connected to the bases of transistors Q4 and Q5, its collector providing an output terminal into which it sinks an output current Iout and its emitter is connected to the anode of a diode D1. The cathode of diode D1 is connected to the base of another NPN transistor Q9 and, through an adjustment impedance 13 which is preferably implemented by a resistor R4 within the adjustment circuit 16, to the negative supply terminal V−. The adjustment impedance may be implemented as a fixed resistor or as an adjustable resistor network such as an R2R ladder composed of a resistor/switch/latch network which may be digitally controlled to provide a variable resistance. Such networks are known and are described, for example, in Paul Horowitz, Winfield Hill, *The Art of Electronics*, Cambridge University Press, New York, 1989 pp 614–617.

Similarly, the emitter of the transistor Q9 is coupled through a resistor R5 within the adjustment circuit 16 to the negative supply terminal V−. The voltage across the resistor R4 is equal to the sum of the voltage across the resistor R5 and the base-emitter voltage of the transistor Q9. Assuming that the collector current of transistor Q9 equals its emitter current, the relationship between the output current Iout and the PTAT current I3 is given by the following equation:

$$I\text{out} = [V_{BE9} + (I3)(R5)]/R4 \qquad (9)$$
$$= [V_{BE9} + (R5/R)V_T\ln(N^2)]/R4 \qquad (10)$$

The overall magnitude, or base value, of the output current Iout may be adjusted by the selection of the resistance value for resistor R4. Additionally, since $V_{BE9}$ has a negative tempco, typically, of approximately −2 mV/°C., and $V_T$ has a positive tempco, the net tempco of Iout may be adjusted by the choice of R and R5. For example, to produce a zero, negative or positive tempco output current, R5 and R may be chosen as follows:

$$R5/R = (V_{BE9})/(V_T\ln N^2), \text{ for a zero Tempco } I\text{out} <$$
$$(V_{BE9})/(V_T\ln N^2), \text{ for a negative Tempco } I\text{out} >$$
$$(V_{BE9})/(V_T\ln N^2), \text{ for a positive Tempco } I\text{out}$$

Early in this analysis of the new current source 10, the assumption was made that R2 equals R3, with the result that the output current Iout is substantially insensitive to variations in power supply voltages over a fairly wide operating range (typically 3V to 7V). But just as the tempco of Iout may be adjusted for compensation purposes, so may the power supply sensitivity. That is, by choosing R3 to be less than R2, the output current Iout will decrease with increasing power supply voltage over the operating range. Conversely, by choosing R2 to be less than R3, the output current Iout will increase with increasing power supply voltage over the operating range.

Figure 3A:
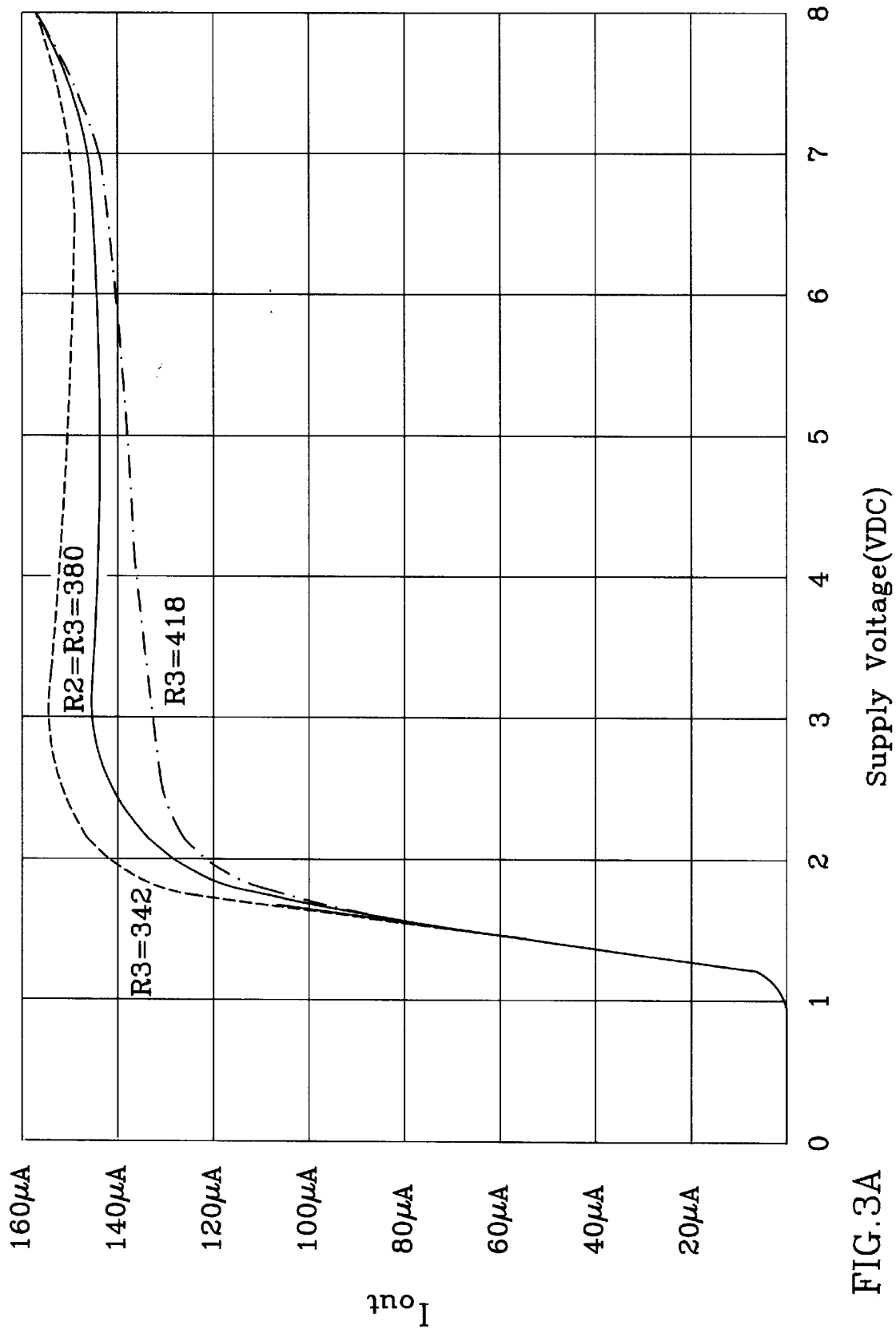
FIG. 3A is a plot of output current versus supply voltage for a given temperature with three different resistor relationships.
Figure 3B:
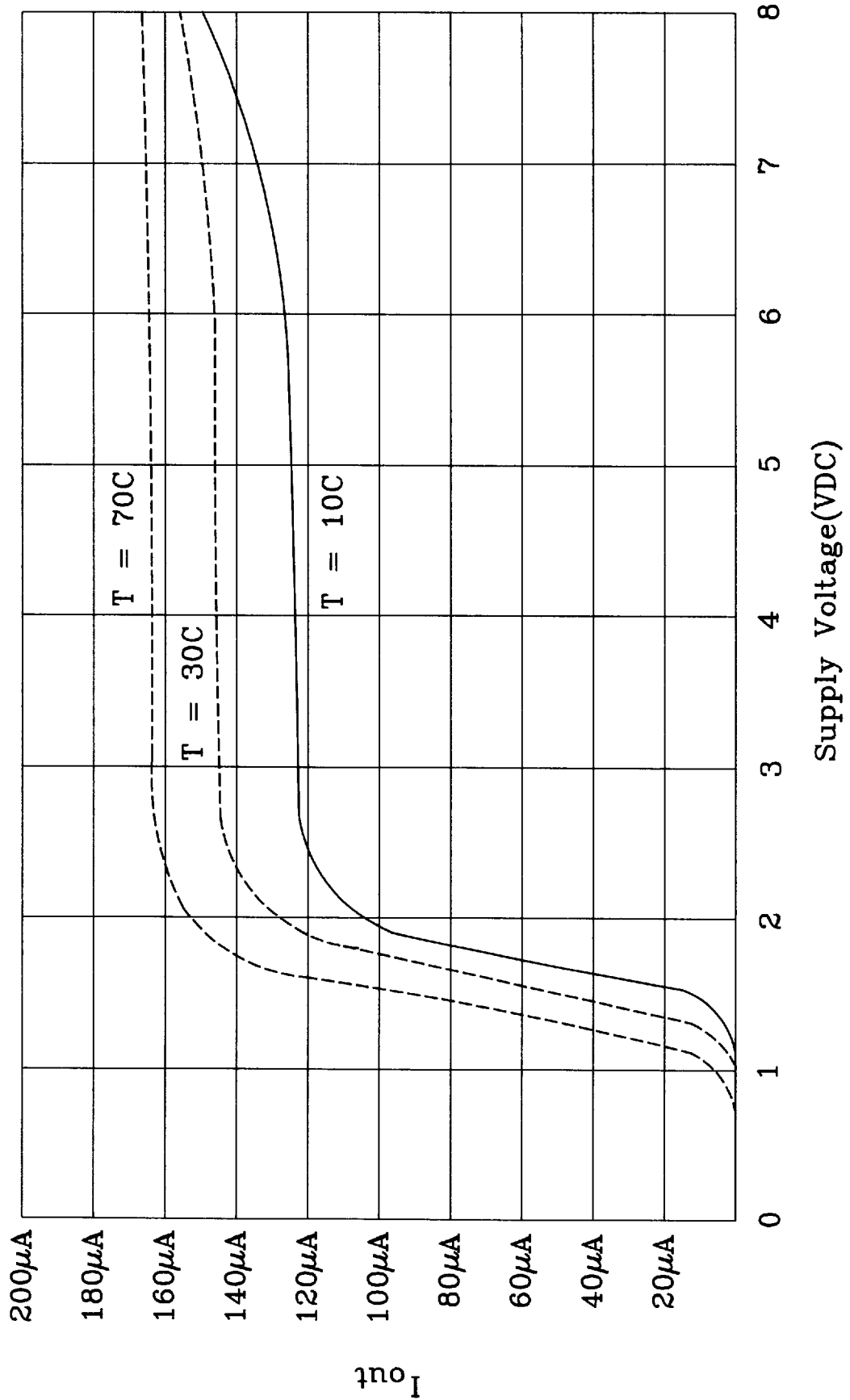
FIG. 3B is a plot of output current versus supply voltage for three different temperatures, with the same resistor relationship for all three curves.

To illustrate this effect, output current is plotted, in FIG. 3A, against supply voltage for three cases where the temperature is set at 27° C. with the resistance of R2 equal to 380Ω. With the resistance of R3 equal to 342Ω the reference current Iout decreases slightly over the supply voltage range from approximately 2.2V to 7V. With the resistance of R3 equal to 418Ω, the reference current Iout increases slightly over the same range; with both resistors equal to 380Ω the reference current is constant from approximately 2.3V to 7V. The plot of output current versus supply voltage of FIG. 3B illustrates a positive tempco implementation of the current source. With R2 and R3 equal to 380Ω output current remains steady over a wide supply voltage range for a given temperature. However, as illustrated, output current increases as temperature increases, ranging from approximately 130 μA at −10° C. and 4VDC supply voltage to approximately 165 μA at 70° C. and 4VDC supply voltage.

Connecting the base of transistor Q8 to the bases of transistors Q4 and Q5 provides base current to transistor Q8 from the resistor R1. Since, as noted above, the current I3 is largely independent of R1 and the current through R1, providing base current to transistor Q8 in this manner allows the transistor Q8 to be driven in a manner which produces minimal disturbance to the remainder of the circuit. That is, base current modulation of the transistor Q8 due to temperature and collector-emitter voltage variations will have little impact upon the remainder of the circuit, whereas, with the transistor Q8 receiving base current from a point lower in the circuit such as the collector of Q6, for example, these effects would be reflected in the current reference output Iout. The optional diode D1 maintains the collector-emitter voltage of the transistor Q8 at a relatively stable level, reducing base current modulation. Due to its immunity to power supply and temperature variations, the current source 10 may be thought of as a current reference and will be referred to as current reference 10.

In summary, one can set the tempco of the current reference 10 to be positive, negative or zero by the selection or adjustment of the resistors R and R5. Additionally, one can set its response to power supply variations by selecting the values of resistors R2 and R3, and the "base" value of the output current by selecting the value of the resistor R4.

One application for which the new current reference is particularly well-suited is within an ADC. ADCs are widely used at the interface between analog and digital systems. For example, analog audio signals in a recording studio are converted to digital format for recording in a compact disk, digital audio tape or other digital medium. Audio recording applications, because of their wide dynamic range and low frequency (humans generally don't hear signals beyond 20 KHz), require relatively high resolution but low bandwidth. Other application areas, such as video and received signal strength indication, require higher speed conversion. A relatively simple ADC architecture, fully parallel, or "flash", provides the highest conversion speed of any ADC.

In an ideal world, the envelope, or range, of the analog signal to be converted would match the input range of the ADC and would remain stable over temperature and supply voltage variations, as would the input range of the ADC and the quantization levels of the ADC. But, in fact, the analog signal range and ADC input range frequently do not match, and the signal levels vary as a function of temperature and supply voltage. For these reasons, an ADC which incorporates the new current reference 10 may provide improved performance by compensating for variations in signal range as well for temperature and power supply dependent signal variations. Additionally, the current reference's base level adjustment may be employed to adjust the input range of the ADC so that it matches the range of the signal to be converted.

Figure 4:
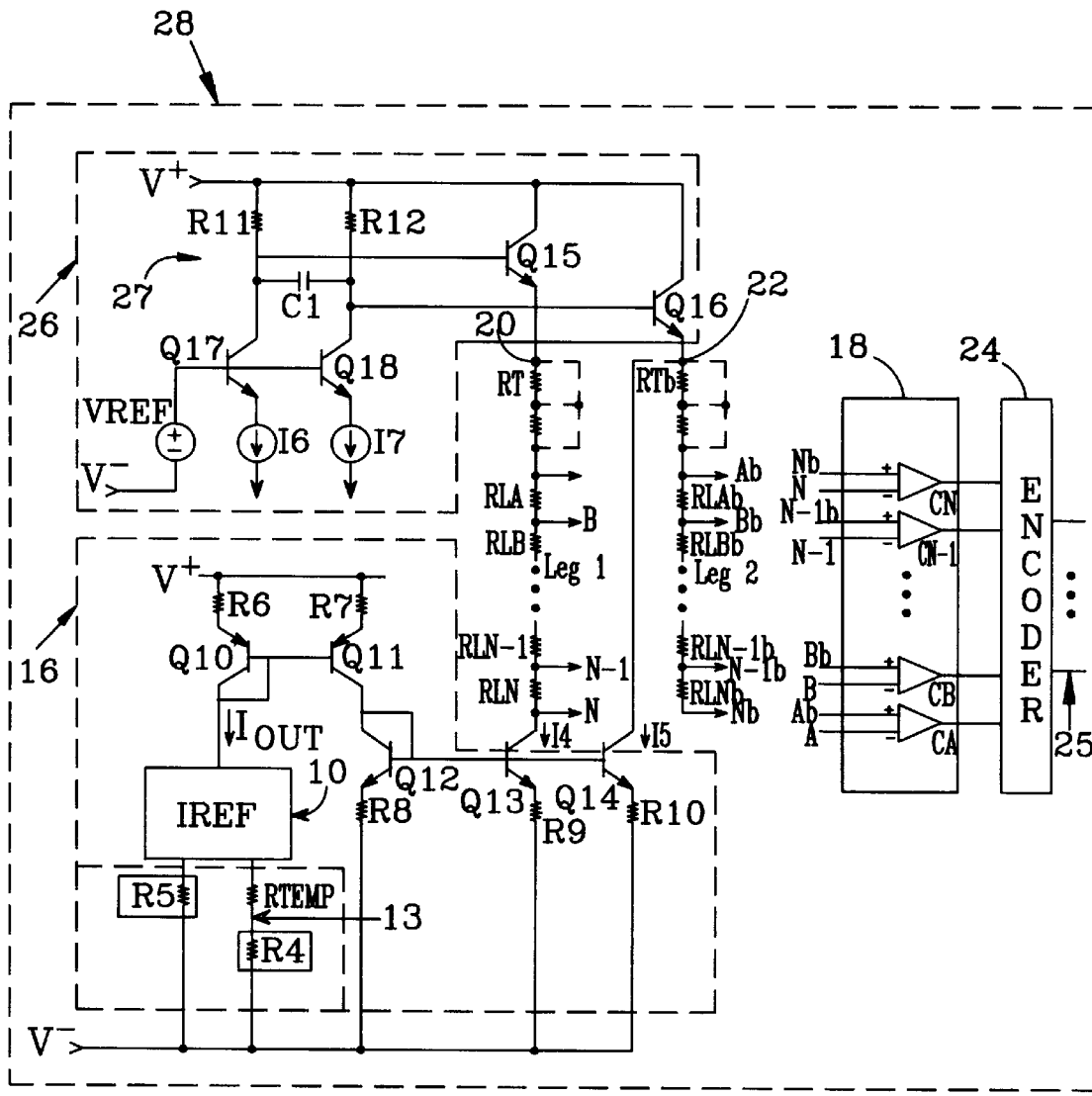
FIG. 4 is a schematic diagram of an ADC which employs the new current source of FIG. 2.

FIG. 4 illustrates the basic components of a flash ADC which employs the new current reference 10. A bank of comparators 18 is connected to receive a differential analog signal from a pair of resistor ladders labeled Leg1 and Leg2. The "rungs" of the resistor ladders are equal-valued resistors, RLA-RLN and RLAb-RLNb, respectively, which, due to their equal values, provide equal voltage "steps", or quantization levels, for comparison by the comparators 18 at each of their respective "taps" A-N and Ab-Nb. The taps A-N and Ab-Nb are connected to comparators within the comparator bank 18, with each tap connected to a comparator input having the same label as the respective ladder tap, e.g., tap A is connected to comparator input A. Resistor ladders Leg1 and Leg2 receive differential input signals, i.e., non-inverted and inverted, at their respective inputs 20 and 22.

Since, as will be discussed in greater detail shortly, equal currents I4 and I5 from the new current source 10 are drawn from the "bottom" of Leg1, i.e., through the resistors RLA-RLN and from the "top" of Leg2, i.e., input 22 of Leg2, the total voltage across Leg1, which also establishes the input range of the ADC, is the product of the total resistance of Leg1 and the reference current I4. The quantization levels are the product of a single resistor and the reference current I4, e.g., (RLA)(I4). The noninverting component Vin of a differential input signal appearing at input 20 forces the voltage at all the taps A-N lower by an amount equal to Vin. At the same time, an inverted signal Vinb appearing at input 22 pulls all the taps Ab-Nb higher by an amount equal to Vinb. For every increase in the non-inverting signal Vin equal to half a quantization level, the inverting signal will decrease by half a quantization level. Therefore, with a variation in Vin of one half of a quantization level, the voltages on taps A-N will move one quantization level with respect to the taps Ab-Nb. As the voltage at tap A drops below the voltage at tap Ab, the comparator CA within the comparator bank 18 will "trip", producing a "1" output. As the input voltage increases, successive comparators within the comparator bank 18 will trip.

This comparison process yields what is sometimes referred to as a "thermometer", or "thermometer scale" output from the comparator bank. It would be impractical to leave the output in this "thermometer format; a 20-bit ADC such as may be employed in audio applications would require 1,048,576 outputs to represent all the possible output states. Therefore a priority encoder 24 is employed to encode the thermometer output into digital values and to latch the digital output 25. Any one of several encoding schemes may be used, including offset binary, 2's complement, sign magnitude, Gray code and binary-coded-decimal(BCD).The basic parallel ADC architecture just described is employed as a component in a number of other types of ADCs including subranging, successive approximation, etc. Flash ADCs and subranging ADCs are discussed in Paul Horowitz, Winfield Hill, *The Art of Electronics*, Cambridge University Press, New York, BAD, pages 621 and 622.

Returning to the current reference 10, the adjustment circuit 16, including resistors R5 and R4, is as illustrated in FIG. 2, except that a resistor RTEMP has been added to the adjustment circuit to aid in its description. The output current Iout is supplied from the collector of a PNP transistor Q10, the emitter of which is coupled through a resistor R6 to the positive supply V+. The transistor Q10 has its base connected to its collector and to the base of a mirroring PNP transistor Q11 that has its collector tied to the collector and base of an NPN transistor Q12. Transistor Q12 is connected via a resistor R8 to the negative supply terminal V− and carries a current that has the same ratio to the output current Iout as the scaling of Q11 has to Q10. NPN transistors Q13 and Q14 are connected to mirror the current through transistor Q12, i.e., at their respective bases to the base of transistor Q12 and at their respective emitters through resistors R9 and R10 to the negative supply terminal V−.

The collector of transistor Q13 is connected to the bottom of Leg1 to draw a current I4, equal to Iout (with a 1:1 ratio for Q10:Q11 and for Q2:Q13,Q14), through the resistor ladder Leg1, and the collector of transistor Q14 is connected to the top of Leg2 to draw a current I5 from the input 22 of Leg2. I4 and I5 are ultimately supplied by input NPN transistors Q15 and Q16, which provide high impedance coupling of differential signals to Leg1 and Leg2, respectively. Drawing the same current, Iout, from both transistors Q15 and Q16 in this fashion biases the inputs 20 and 22 to the same voltage. Additionally, employing resistors RLAb-RLNb in the input paths to the comparators CA-CN cancels the effect of the comparators' input bias currents. That is, whatever voltage attributable to bias currents appearing at a comparator's noninverting input, will also appear at its inverting input and bias current errors will thus be circumvented.

An interface circuit 26, which provides and interface between the ADC ladders Leg1 and Leg2 and a differential analog current signal which is to be converted, includes transistors Q15 and Q16 which form a drive stage for a differential amplifier 27. The amplifier stage includes two NPN transistors Q17 and Q18 connected at their respective collectors through resistors R11 and R12 to the positive supply V+, and also to the bases of Q15 and Q16, respectively. Their bases are connected to a voltage reference VREF and their emitters supply differential currents I6 and I7. In a preferred embodiment, one suitable for use with an RF receiver discussed in relation to FIG. 5, a capacitor C1 is connected across the collectors of transistors Q17 and Q18 to form a low pass filter having a cutoff frequency of ½π(R11)(C1). For example, with C1 equal to 150 pF (viewed as two 300 pF in series with a virtual ground between them) and R11 and R12 equal to 460Ω, the cutoff frequency is approximately 1.15 Mhz. The differential currents represent, basically, a differential current mode analog signal that is to be converted to digital form and would be supplied from another circuit, not shown, which produces the analog signal. The differential amplifier pair Q17 and Q18 convert this differential current to a differential voltage available at their collectors. Transistors Q17 and Q18 act as buffers and, in the receiver application described in relation to FIG. 5, they separate a high frequency signal appearing at their emitters (which is fed to a collision detection circuit) from a lower frequency signal, the envelope of the high frequency signal, which appears across the capacitor C1.

As discussed in relation to FIG. 2, resistor R5 may be chosen to determine the tempco of the current reference 10 and to, for example, offset the tempco of the differential current signal applied to the amplifier 27 as well as that of the resistors within the ladders Leg1 and Leg2. Additionally, in the preferred embodiment the adjustment impedance 13 includes a resistor RTEMP, equal to R5, in series with the resistor R4. R4 is chosen to set the basic value of Iout and to thereby determine, in conjunction with the resistor values RLA-RLN, the input range (total voltage drop across Leg1) and quantization levels (twice the voltage drop across each of the resistors RLA-RLN). A larger value for R4 reduces the magnitude of Iout and the size of the quantization levels for the ADC, making the ADC more sensitive in this respect. Trim resistors RT and RTb at the top leads of ladders Leg1 and Leg2, respectively between RLA and Leg1 input 20 and between RLAb and Leg2 input 22, produce an offset which ensures that the ADC does not begin transistioning, i.e., none of the comparators in the comparator bank 18 trip until the level of the input signal (differential input currents I6 and I7) reaches a desired level.

In a preferred IC embodiment the value of the trim resistors are adjusted via mask changes or laser links during the IC production process. Additionally, as noted in the discussion related to FIG. 2, the resistors of the adjustment circuit 13 (R4, R5 and RTEMP) could be implemented as a digitally controlled resistor network to permit adjustment of the ADC's range and quantization levels and tempco under software control, for example. This feature may be employed during a manufacturing test, with resistor settings stored in non-volatile memory such as EEPROM, or it could be done "on-the-fly" in the field to accommodate varying environmental conditions or updated applications.

Figure 5:
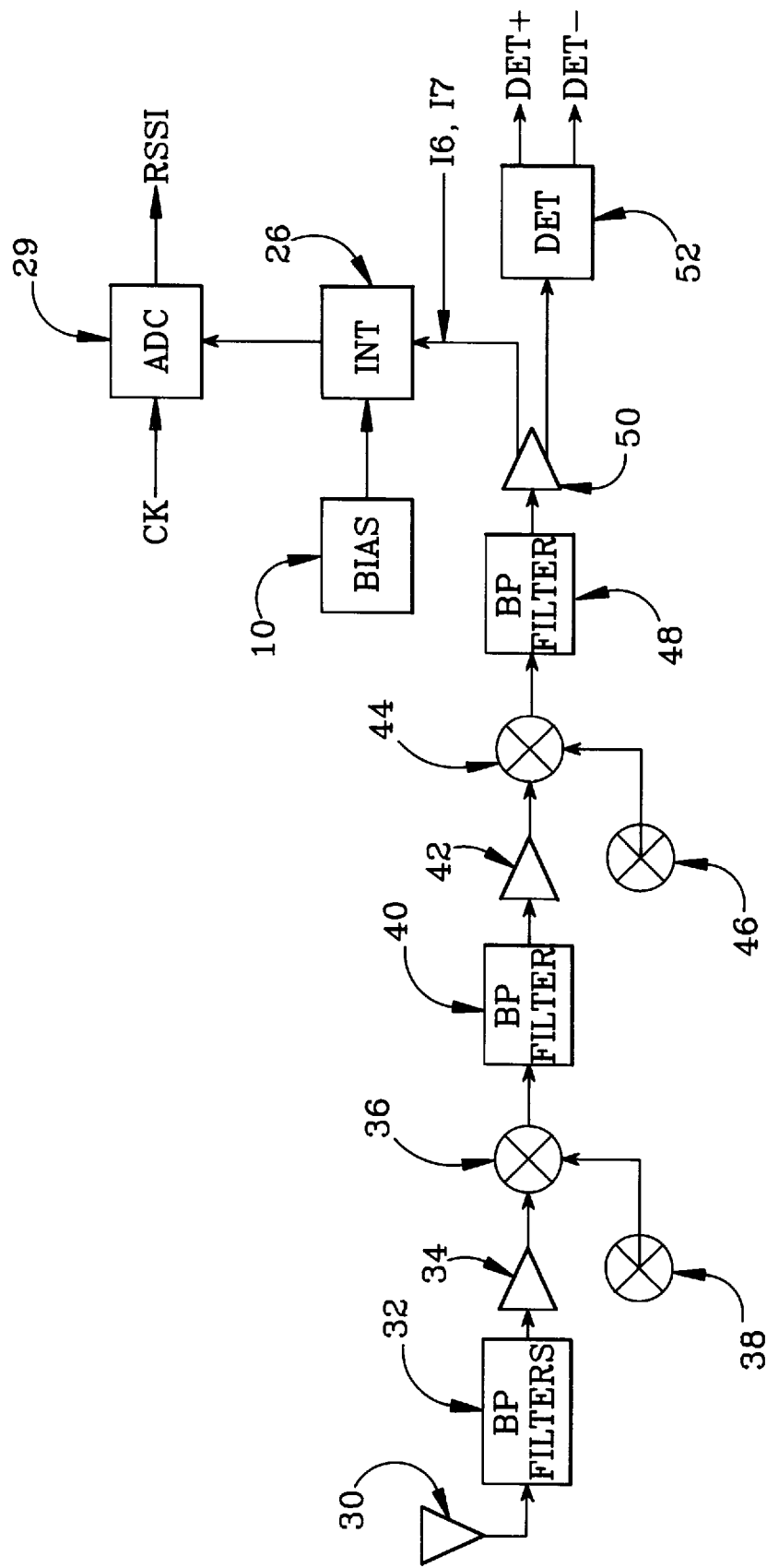
FIG. 5 is a block diagram of an RF receiver which employs the ADC of FIG. 3.

The interface circuit 26, amplifier 27, resistor ladders Leg1 and Leg2, adjustment circuit 16, comparator bank 18 and encoder 24 together form an ADC/interface circuit combination 28 which, as will be discussed in greater detail in relation to FIG. 5, is particularly suited for use in a radio frequency (RF) communications system received signal strength indicator(RSSI).

The RF receiver of FIG. 5 includes an antenna 30 connected to receive RF signals and deliver the received signals to filters 32 where they are band-pass filtered. The filtered signals are transmitted to a low noise amplifier 34 which amplifies the filtered signals and passes them to a mixer 36 where they are combined with a local oscillator 38. The resultant is filtered by a bandpass filter 40. After filtering, the signals are amplified by an intermediate frequency (IF) amplifier 42 which transmits amplified signals to a mixer 44 where the signals are mixed with a local oscillator 46. The mixed signals are then filtered in a band pass filter 48 and amplified by an amplifier 50.

One output of the amplifier 50 is, in the preferred embodiment, the differential current signal, (I6,I7) as described in relation to FIG. 4. The other output of the amplifier is a differential data signal. The differential current signal is fed to the interface circuit 26 which receives bias current from the new current source 10 and the signal is converted from an analog current input to a digital voltage output by the analog to digital converter 29, also as described in relation to FIG. 4. The other output of the amplifier 50, the digital data signal, is fed to the detector circuit 52 which produces a differential detector output signal DET+, DET−. Digital communications systems, demodulation and signal detection are known in the art. For a more detailed discussion see Leon W. Couch II, *Digital and Analog Communications Systems*, Macmillan Publishing Co., Inc., New York, 1983, pp 214–223.

In the preferred embodiment, the digital output signal from the ADC 29 is a received signal strength indicator (RSSI) which is indicative of the strength of signals received at the antenna 30. This signal may be used, for example, to adjust a variety of circuits within the receiver such as the gain of the amplifiers within the receiver's signal path.

Due to its potential for widespread use in other circuits, it is important that the RSSI signal reflect the relative level of a received signal. That is, a given signal strength at the antenna 30 should always yield the same digital value of RSSI. At low signal levels a signal will be lost in noise, while at higher signal levels the receiver's response will tend to flatten out. The ADC input range is therefore generally designed to operate within a band between the two extremes of received signal strength. In this case, the adjustment circuit 16 (FIGS. 2,4) of the ADC 29 may be implemented with fixed resistors which set the current reference output Iout and ADC input range at a fixed value. However, with variations in the receiver circuitry or in the quality of signals received at the antenna 30, one may wish to adjust the impedance levels "on the fly" and this may be accomplished, as indicated above, using a digitally controlled resistor network as an implementation of the impedance 13 of FIG. 4.

The forgoing description of specific embodiments of the invention has been presented for the purposes of illustration and description. It is not intended to be exhaustive or to limit the invention to the precise forms disclosed, and many modifications and variations are possible in light of the above teachings. The embodiments were chosen and described in order to best explain the principles of the invention and its practical application, to thereby enable others skilled in the art to best utilize the invention. It is intended that the scope of the invention be limited only by the claims appended hereto.

I claim:

1. A current reference circuit, comprising:

a proportional to absolute temperature (PTAT) current source having at least one resistor, said PTAT current source producing a PTAT current output which is a function of said resistor, and a complementary to absolute temperature (CTAT) current source which produces a CTAT current output in response to a constant current input, said CTAT current source (a) connected to receive a PTAT current input from said PTAT current source, (b) having at least one resistor, and (c) connected to produce a reference output current which can have a zero, negative or positive temperature coefficient, depending upon the values of said PTAT and CTAT current source resistors.

2. The current reference circuit of claim 1, said CTAT current source providing said reference output current with a base level, further comprising an adjustment circuit connected to adjust said base level.

3. The current reference circuit of claim 2, wherein said adjustment circuit comprises an adjustable resistor connected to receive said reference output current.

4. The current reference circuit of claim 1, wherein at least one of said resistors is adjustable.

5. The current reference circuit of claim 1, wherein said PTAT current source includes a first ratioed pair of bipolar transistors connected to mirror current from said startup current source into a second pair of ratioed bipolar transistors, said second pair of transistors being connected in a cross-coupled connection such that the PTAT current is proportional to absolute temperature and to the square of the transistor pairs' ratio.

6. The current reference circuit of claim 5, wherein:

said PTAT current source includes a startup current source, and said CTAT current source comprises:

a first bipolar transistor having a current control terminal and two current conduction terminals, said first bipolar transistor connected to receive the PTAT output current from said PTAT current source at one of its conduction terminals and being connected at its other conduction terminals in circuit with a negative supply terminal, and a second bipolar transistor having a current control terminal and two current conduction terminals, said second bipolar transistor connected at its current control terminal to receive a bias current from said startup current source, one of said current control terminals connected to provide said reference output current and the other of said current control terminals coupled to the current control terminal of said first bipolar transistor in circuit with a negative supply terminal.

7. An analog to digital converter (ADC), comprising:

a differential voltage input for receiving analog signals which are to be converted into digital form, a differential resistor ladder connected to receive differential voltage signals from said input, said ladder comprising at least one leg of resistors with taps at the junctions of said resistors, and a current reference connected to said ladder to produce a voltage across at least one leg of the ladder which is substantially equal to the input range of the ADC, and to produce a voltage across each resistor within the leg equal to one of the ADC's quantization levels, said current reference comprising:

a proportional to absolute temperature (PTAT) current source having at lease one resistor, said PTAT current source producing a PTAT current output which is a function of said resistor, and a complementary to absolute temperature (CTAT) current source which produces a CTAT current output in response to a constant current input, said CTAT current source (a) connected to receive a PTAT current input from said PTAT current source, (b) having at least one resistor, and (c) connected to produce a reference output current which can have a zero, negative or positive temperature coefficient, depending upon the values of said PTAT and CTAT current source resistors.

8. The ADC of claim 7, wherein said resistor ladder comprises two legs of equal-valued resistors with said current reference connected to draw equal currents from each leg, from the top of one leg and from the bottom of the other.

9. The ADC of claim 8, further comprising a bank of comparators connected to compare the voltages at the taps of one leg to the voltages at the taps of the other leg and to thereby produce a digital thermometer output signal corresponding to an analog signal appearing at said differential voltage input.

10. The ADC of claim 9, further comprising an encoder connected to encode said thermometer output signal.

11. A received signal strength indicator, comprising:
an interface circuit including an input low pass filter amplifier connectable to receive a differential input current representative of an amplitude envelope of an RF signal and to produce a low pass filtered differential voltage output, and
an analog to digital converter (ADC) connected to convert said differential voltage output into digital form, said ADC including a current reference connected to determine its quantization levels, said ADC comprising:
differential voltage inputs connected to receive said differential voltage output,
a differential resistor ladder connected to receive differential voltage signals from said input, said ladder comprising at least one leg of resistors with taps at the junctions of said resistors, and
a current reference connected to said ladder to produce a voltage across at least one leg of the ladder, said voltage being substantially equal to the input range of the ADC, and to produce a voltage across each resistor within the leg equal to one of the ADC's quantization levels, said current reference comprising:
a proportional to absolute temperature (PTAT) current source having at lease one resistor, said PTAT current source producing a PTAT current output which is a function of said resistor, and
a complementary to absolute temperature (CTAT) current source which produces a CTAT current output in response to a constant current input, said CTAT current source (a) connected to receive a PTAT current input from said PTAT current source, (b) having at least one resistor, and (c) connected to produce a reference output current which can have a zero, negative or positive temperature coefficient, depending upon the values of said PTAT and CTAT current source resistors.

12. A radio frequency (RF) receiver, comprising:
an antenna connected to receive RF signals,
a bandpass filter connected to filter said received signals,
an amplifier connected to amplify said RF signals and to produce a differential current output signal representative of said RF signals, and
a received signal strength indicator which comprises:
an interface circuit including an input low pass filter amplifier connectable to receive a differential input current representative of a demodulated RF signal and to produce a low pass filtered differential voltage output, and
an analog to digital converter (ADC) having differential voltage inputs connected to receive said differential voltage output, said ADC further comprising:
a differential resistor ladder connected to receive differential voltage signals from said input, said ladder comprising at least one leg of resistors with taps at the junctions of said resistors, and
a current reference connected to said ladder to produce a voltage across at least one leg of the ladder which is substantially equal to the input range of the ADC, and to produce a voltage across each resistor within the leg equal to one of the ADC's quantization levels, said current reference comprising:
a proportional to absolute temperature (PTAT) current source having at lease one resistor, said PTAT current source producing a PTAT current output which is a function of said resistor, and
a complementary to absolute temperature (CTAT) current source which produces a CTAT current output in response to a constant current input, said CTAT current source (a) connected to receive a PTAT current input from said PTAT current source, (b) having at least one resistor, and (c) connected to produce a reference output current which can have a zero, negative or positive temperature coefficient, depending upon the values of said PTAT and CTAT current source resistors.

13. A current reference circuit, comprising:
a proportional to absolute temperature (PTAT) current source comprising:
a first pair of transistors connected in a current mirror circuit,
a second pair of transistors that are cross-coupled to each other and connected to receive currents from respective transistors of said first pair, said second pair of transistors have current outputs that are connected together to yield a combined PTAT current,
a first resistor connected between respective transistors of said first and second transistor pairs, and
a second resistor connected between one of the transistors of said second pair and the connection between said second pair's current outputs, and
a complementary to absolute temperature (CTAT) current source, comprising:
an output transistor connected to be biased in common with said first pair of transistors, and to produce a reference current output,
an impedance circuit connected to receive said reference current output,
an input transistor connected to receive said combined PTAT current, to produce a current output, and to be biased by said impedance, and
a third resistor connected to receive the current output flow from said output transistor,
the temperature coefficient of said reference current output depending upon the resistance values of said first, second and third resistors.

14. The current reference circuit of claim 13, wherein said impedance circuit is adjustable to control the magnitude of said reference current output.

* * * * *